United States Patent
Shim et al.

(10) Patent No.: US 9,412,972 B2
(45) Date of Patent: *Aug. 9, 2016

(54) ORGANIC LIGHT-EMITTING DISPLAY APPARATUS

(71) Applicant: SAMSUNG DISPLAY CO., LTD., Yongin, Gyeonggi-Do (KR)

(72) Inventors: Changwoo Shim, Yongin (KR); Hyun Kim, Yongin (KR); Cheho Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/628,403

(22) Filed: Feb. 23, 2015

(65) Prior Publication Data

US 2016/0079564 A1    Mar. 17, 2016

(30) Foreign Application Priority Data

Sep. 16, 2014  (KR) .......................... 10-2014-0122940

(51) Int. Cl.
*H01L 51/00* (2006.01)
*H01L 51/52* (2006.01)
*H01L 27/32* (2006.01)

(52) U.S. Cl.
CPC ........ *H01L 51/5256* (2013.01); *H01L 27/3246* (2013.01); *H01L 27/3258* (2013.01)

(58) Field of Classification Search
CPC ............ H01L 51/0545; H01L 51/0036; H01L 51/0541; H01L 51/5012; H01L 23/3135
USPC ........................... 257/40, 433, 709, 710, 790
See application file for complete search history.

(56) References Cited

U.S. PATENT DOCUMENTS

| 9,070,889 | B2* | 6/2015 | Lee ..................... H01L 51/5256 257/40 |
| 2003/0042852 | A1 | 3/2003 | Chen |
| 2006/0076887 | A1 | 4/2006 | Kang |
| 2009/0101383 | A1 | 4/2009 | Miyagi et al. |
| 2009/0121333 | A1 | 5/2009 | Aitken et al. |
| 2010/0181903 | A1 | 7/2010 | Kim et al. |
| 2012/0217535 | A1 | 8/2012 | Van De Weijer et al. |
| 2014/0138634 | A1 | 5/2014 | Lee et al. |

FOREIGN PATENT DOCUMENTS

| KR | 10-2006-0032089 A | 4/2006 |
| KR | 10-2009-0040864 A | 4/2009 |
| KR | 10-2010-0085347 A | 7/2010 |
| KR | 10-2014-0064136 A | 5/2014 |

* cited by examiner

*Primary Examiner* — Quoc Hoang
(74) *Attorney, Agent, or Firm* — Lee & Morse, P.C.

(57) ABSTRACT

An organic light-emitting display apparatus, includes a substrate including display area and a non-display area; a display device in the display area on the substrate; and a thin film encapsulating layer that covers the display device and includes an encapsulating inorganic layer and an encapsulating organic layer, the encapsulating inorganic layer including a plurality of inorganic layers and the encapsulating organic layer including a plurality of organic layers, at least one organic layer among the plurality of organic layers including a plurality of holes, and the plurality of holes being filled with an inorganic layer on the at least one organic layer.

17 Claims, 4 Drawing Sheets

ORGANIC LIGHT-EMITTING DISPLAY APPARATUS

CROSS-REFERENCE TO RELATED APPLICATION

Korean Patent Application No. 10-2014-0122940, filed on Sep. 16, 2014, in the Korean Intellectual Property Office, and entitled: "Organic Light-Emitting Display Apparatus," is incorporated by reference herein in its entirety.

BACKGROUND

1. Field

One or more exemplary embodiments relate to an organic light-emitting display apparatus.

2. Description of the Related Art

An organic light-emitting display apparatus may include organic light-emitting devices (OLEDs) that include hole injection electrodes, electron injection electrodes, and organic emission layers formed between the hole injection electrodes and the electron injection electrodes.

SUMMARY

Embodiments may be realized by providing an organic light-emitting display apparatus, including a substrate including display area and a non-display area; a display device in the display area on the substrate; and a thin film encapsulating layer that covers the display device and includes an encapsulating inorganic layer and an encapsulating organic layer, the encapsulating inorganic layer including a plurality of inorganic layers and the encapsulating organic layer including a plurality of organic layers, at least one organic layer among the plurality of organic layers including a plurality of holes, and the plurality of holes being filled with an inorganic layer on the at least one organic layer.

The plurality of holes may be in the non-display area.

The plurality of holes may surround the display area.

The holes may be identical in shape and arranged in a pattern such that the plurality of holes are spaced apart from each other at predetermined intervals.

The thin film encapsulating layer may include a first organic layer, a first inorganic layer, a second organic layer, and a second inorganic layer that are sequentially stacked, and the first and second inorganic layers may contact each other at an outer region of the first and second organic layers.

The plurality of holes may be in the second organic layer, and the plurality of holes may be filled with the second inorganic layer such that the second inorganic layer contacts the first inorganic layer.

A protection layer including an inorganic material may be between the display device and the first organic layer, and a plurality of second holes may be in the first organic layer and filled with the first inorganic layer such that the first inorganic layer contacts the protection layer.

A protection layer including an inorganic material may be between the display device and the first organic layer, and a plurality of second holes may be in the first organic layer and filled with the first inorganic layer such that the first inorganic layer contacts the protection layer.

The apparatus may further include a thin film transistor that is electrically connected to the display device and includes an active layer, a gate electrode, a source electrode, and a drain electrode. A gate insulating layer may be between the active layer and the gate electrode, an interlayer insulating layer may be between the gate electrode, the source electrode, and the drain electrode, and the gate insulating layer and the interlayer insulating layer may extend to the non-display area and may form a display area inorganic layer on the substrate.

The encapsulating inorganic layer may cover the display area, may be on the display area inorganic layer, and may extend to an outer region of the substrate.

The apparatus may further include a blocking unit between the display area inorganic layer and the encapsulating inorganic layer, in the display area.

The blocking unit may include a plurality of blocking units.

Respective heights of the plurality of blocking units may be different and may be greater toward the outer region of the substrate.

The apparatus may further include a passivation layer that covers the thin film transistor and a pixel defining layer on the passivation layer. The blocking unit may include a same material as one or more of the passivation layer or the pixel defining layer.

The encapsulating inorganic layer may extend beyond an edge of the display area inorganic layer and may contact a side of the display area inorganic layer and an upper surface of the substrate.

The display device may be an organic light-emitting device including a first electrode, a second electrode, and an intermediate layer between the first and second electrodes.

At least one of the plurality of organic layers may be between the plurality of inorganic layers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
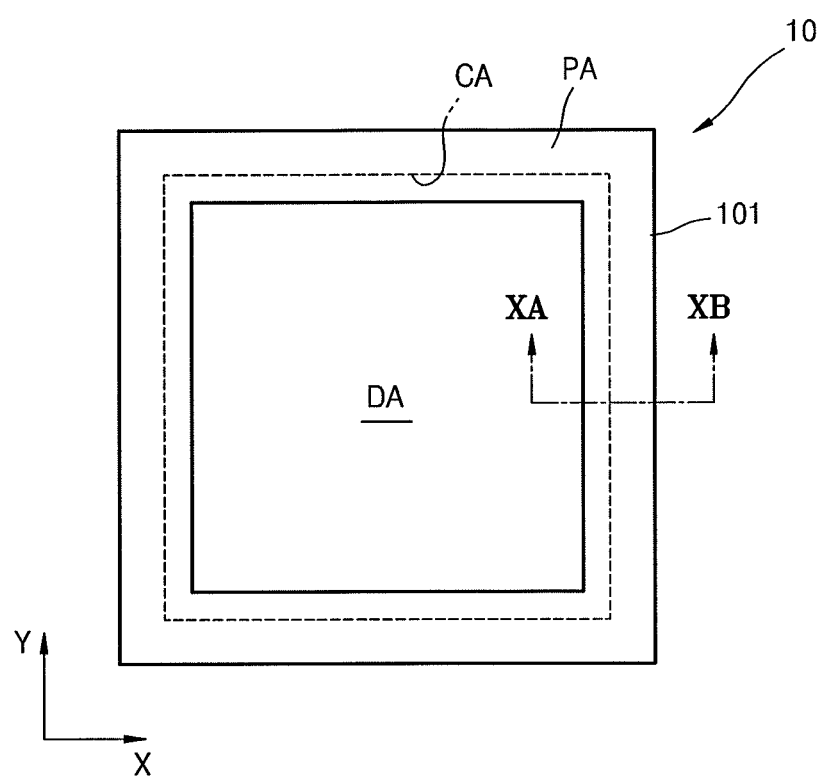
FIG. 1 illustrates a schematic plan view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that although the terms "first", "second", etc., may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes or dimensions of elements, e.g., layers or regions, in the drawings may be exaggerated for convenience of explanation. In other words, since sizes and thicknesses of components in the drawings are arbitrarily illustrated for convenience of explanation, the following exemplary embodiments are not limited thereto.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Reference will now be made in detail to exemplary embodiments, examples of which are illustrated in the accompanying drawings, wherein like reference numerals refer to like elements throughout. The description of like elements will not be repeated. As used herein, the term "and/or" includes any and all combinations of one or more of the associated listed items. Expressions such as "at least one of," when preceding a list of elements, modify the entire list of elements and do not modify the individual elements of the list.

Figure 2:
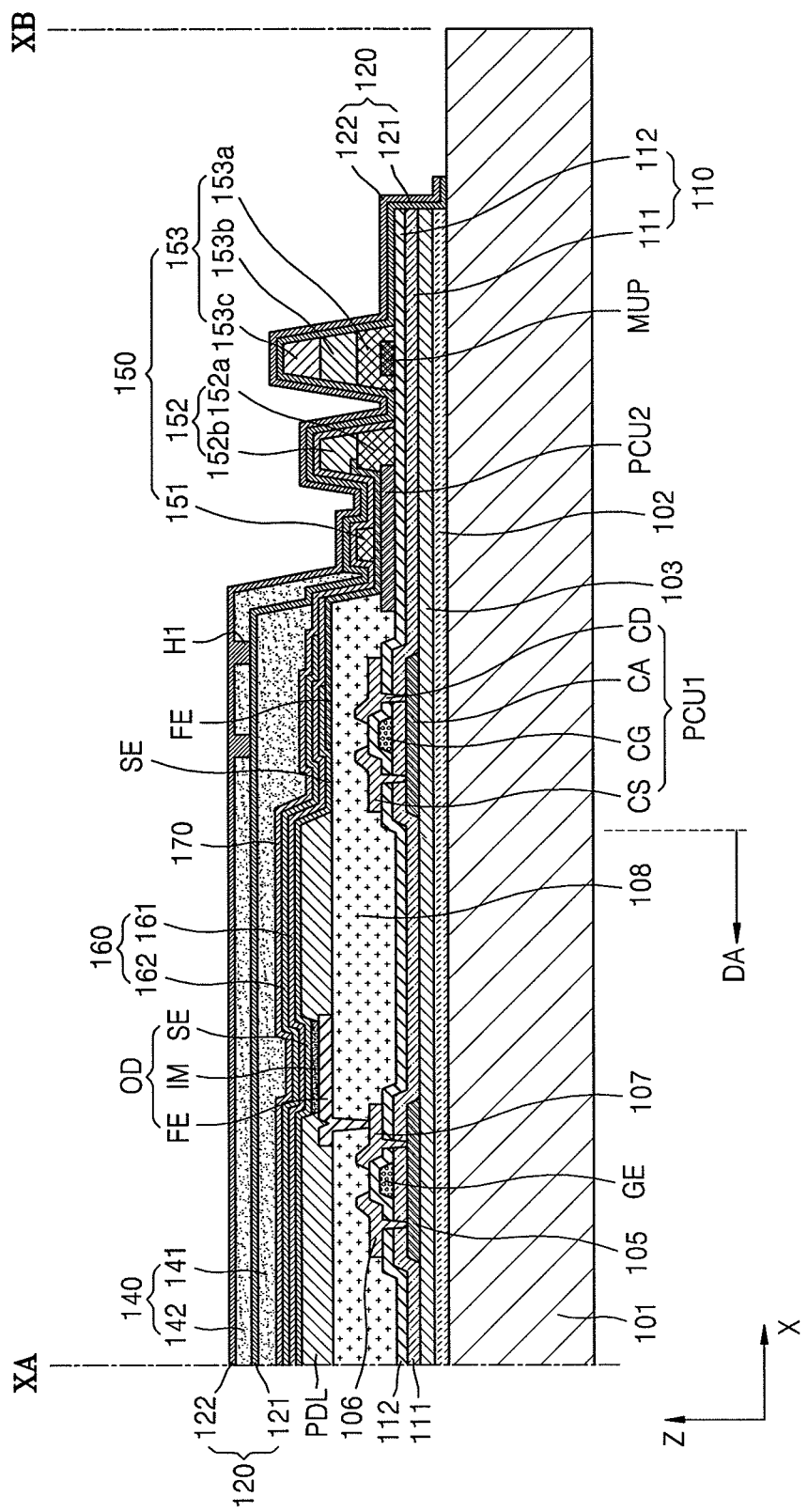
FIG. 2 illustrates a schematic cross-sectional view of the organic light-emitting display apparatus cut along the line XA-XB of FIG. 1.

FIG. 1 illustrates a schematic plan view of an organic light-emitting display apparatus 10 according to an embodiment. FIG. 2 illustrates a schematic cross-sectional view of the organic light-emitting display apparatus 10 cut along the line XA-XB of FIG. 1. Referring to FIGS. 1 and 2, the organic light-emitting display apparatus 10 according to an embodiment may include a substrate 101 on which a display area DA and a non-display area are defined, a display device OD formed in the display area DA on the substrate 101, and an thin film encapsulating layer TFE covering the display device OD.

The substrate 101 may include various materials. For example, the substrate 101 may be formed of glass, metal, or other organic materials.

In an embodiment, the substrate 101 may be formed of a flexible material. The substrate 101 formed of a flexible material refers to a flexible substrate that may be easily bent, folded, or rolled. The substrate 101 formed of a flexible material may be formed using thin glass, metal, or plastic. For example, when plastic is used, the substrate 101 may be formed of polyimide (PI).

The substrate 101 may be partitioned into a peripheral area PA and a central area CA. For example, the peripheral area PA may be an area adjacent to edges of the substrate 101 and the central area CA may be an area inside the peripheral area PA. The central area CA may include at least the display area DA.

At least one display device OD may be disposed in the display area DA, and an image may be displayed. The display device OD may vary, and may be, for example, an organic light-emitting device (OLED).

The non-display area may be formed around the display area DA. For example, the non-display area may surround the display area DA. In an embodiment, the non-display area may be adjacent to a plurality of sides of the display area DA. In an embodiment, the non-display area may be adjacent to one side of the display area DA. In an embodiment, only the display area DA may be provided in the central area CA. The non-display area may be formed only in the peripheral area PA.

A barrier layer 102 may be formed on the substrate 101, and a buffer layer 103 may be formed on the barrier layer 102.

The barrier layer 102 may block impurities, such as moisture or oxygen, which may penetrate through the substrate 101. The barrier layer 102 may be formed of various inorganic materials including, for example, oxide, nitride, or oxynitride. For example, the barrier layer 102 may include silicon nitride ($SiN_x$), silicon oxide ($SiO_2$), or silicon oxynitride ($SiO_xN_y$). The barrier layer 102 may be formed on the display area DA and extend so that the barrier layer 102 may also be disposed on the peripheral area PA. In an embodiment, the barrier layer 102 may be omitted.

The buffer layer 103 may provide a planarized surface on the substrate 101 and may be a primary layer for blocking impurities or moisture that may penetrate through the substrate 101. In an embodiment, the buffer layer 103 may be omitted.

A thin film transistor (TFT) may be formed in the display area DA on the buffer layer 103. The TFT formed on the display area DA may function as a portion of a circuit for driving the display device OD.

Hereinafter, an example in which the TFT is a top gate type formed by sequentially stacking an active layer 105, a gate electrode GE, a source electrode 106, and a drain electrode 107 is described. In an embodiment, various types of TFTs, such as a bottom gate type TFT, may be applied.

The active layer 105 may be formed on the buffer layer 103. The active layer 105 may include a semiconductor material, for example, amorphous silicon or polycrystalline silicon. In an embodiment, the active layer 105 may include various materials. In an embodiment, the active layer 105 may include an organic semiconductor material.

In an embodiment, the active layer 105 may include an oxide semiconductor material. For example, the active layer 105 may include an oxide of a material selected from metal elements of groups 12, 13, and 14. For example, the active layer 105 may include an oxide of zinc (Zn), indium (In), gallium (Ga), tin (Sn), cadmium (Cd), germanium (Ge), or a combination thereof.

A gate insulating layer 111 may be formed on the active layer 105. The gate insulating layer 111 may be a single layer formed of an inorganic material, for example, $SiO_2$ and/or $SiN_x$, or be formed of multiple layers of the inorganic material. The gate insulating layer 111 may insulate the active layer 105 and the gate electrode GE from each other. The gate insulating layer 111 may be formed not only in the display area DA, but may also extend to the peripheral area PA.

The gate electrode GE may be formed on the gate insulating layer 111. The gate electrode GE may be connected to a gate line (not shown) that applies on/off signals to the TFT.

The gate electrode GE may be formed of a low resistance metal material. For example, the gate electrode GE may be formed as a single layer formed of a conductive material, for example, molybdenum (Mo), aluminum (Al0, copper (Cu), or titanium (Ti), or be formed of multiple layers of the conductive material.

An interlayer insulating layer 112 may be formed on the gate electrode GE. The interlayer insulating layer 112 may insulate the source and drain electrodes 106 and 107 from the gate electrode GE. The interlayer insulating layer 112 may be formed not only in the display area DA, but may also extend to a portion of the peripheral area PA. The gate insulating layer 111 and the interlayer insulating layer 112 may be formed as a display area inorganic layer 110 on the buffer layer 103 in the peripheral area PA.

The interlayer insulating layer 112 may be formed as a single layer formed of an inorganic material, for example, a metal oxide or a metal nitride, or be formed of multiple layers of the inorganic material. For example, the inorganic material may be $SiO_2$, $SiN_x$, $SiO_xN_y$, aluminum oxide ($Al_2O_3$), titanium oxide ($TiO_2$), tantalum oxide ($Ta_2O_5$), hafnium oxide ($HfO_2$), or zinc oxide ($ZnO_2$).

The source and drain electrodes 106 and 107 may be formed on the interlayer insulating layer 112. Each of the source and drain electrodes 106 and 107 may be formed as a single layer of a material with excellent conductivity, or be formed of multiple layers of the material. The source and drain electrodes 106 and 107 may contact the active layer 105.

A first circuit unit PCU1 may be formed in the non-display area. The first circuit unit PCU1 may transmit an electric signal for driving the display device OD to the display device OD or convert the electric signal.

The first circuit unit PCU1 may have various forms. According to an embodiment, the first circuit unit PCU1 may include a circuit active layer CA, a circuit gate electrode CG, a circuit source electrode CS, and a circuit drain electrode CD. The circuit active layer CA, the circuit gate electrode CG, the circuit source electrode CS, and the circuit drain electrode CD may be simultaneously formed using the same material as the active layer 105, the gate electrode GE, and the source and drain electrodes 106 and 107 of the TFT described above, respectively.

According to an embodiment, a second circuit unit PCU2 may be disposed on the interlayer insulating layer 112. The second circuit unit PCU2 may transmit an electric signal for driving the display device OD to the display device OD or convert the electric signal.

A passivation layer 108 may cover the TFT and the first circuit unit PCU1. The passivation layer 108 may cover a stair-step structure resulting from the formation of the TFT and planarize an upper surface of the source electrode 106 and the interlayer insulating layer 112, and may prevent faults from being generated in the display device OD, such as the OLED, for example, due to protrusions and depressions in a lower portion.

The passivation layer 108 may be formed as a single layer formed of an organic material or be formed of multiple layers of the organic material. The organic material may include polymer derivatives having commercial polymers such as polymethylmethacrylate (PMMA) or polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof. In an embodiment, the passivation layer 108 may be formed as a composite structure including an inorganic insulating layer and an organic insulating layer.

The display device OD may be formed on the passivation layer 108. The display device OD may be electrically connected to the TFT, and may include a first electrode FE, a second electrode SE, and an intermediate layer IM provided between the first and second electrodes FE and SE.

The first electrode FE may be electrically connected to any one of the source and drain electrodes 106 and 107. The first electrode FE may have various forms. For example, the first electrode FE may be patterned in an island shape.

The first electrode FE may be formed of various materials. For example, the first electrode FE may include one or more of transparent conductive oxides, for example, indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode FE may include a metal having a high reflectivity, such as silver (Ag).

The intermediate layer IM may include an organic emission layer that may be formed of a low molecular material or a polymer material. In addition to the organic emission layer, according to an embodiment, the intermediate layer IM may further include one or more of a hole injection layer, a hole transport layer, an electron transport layer, or an electron injection layer.

The organic emission layer may be independently formed in OLEDs. The OLEDs may respectively emit red, green, and blue light. In an embodiment, a common organic emission layer may be formed over all the OLEDs. For example, a plurality of organic emission layers that emit red, green, and blue light may be vertically stacked or combined to emit white light. Color combinations for emitting white light is not limited to the description above. A color converting layer or a color filter that converts white light into light of a predetermined color may be additionally provided.

The second electrode SE may be formed of various conductive materials. For example, the second electrode SE may include lithium (Li), calcium (Ca), lithium fluoride (LiF), Al, magnesium (Mg), or Ag. The second electrode SE may be formed as a single layer or multiple layers using one or more the materials described above or an alloy thereof.

A pixel defining layer PDL may be formed on the passivation layer 108. The pixel defining layer PDL may be formed such that a predetermined region of the first electrode FE is not covered. The intermediate layer IM may be formed on the region of the first electrode FE which is not covered by the pixel defining layer PDL, and the second electrode SE may be formed on the intermediate layer IM.

The pixel defining layer PDL may be formed of at least one organic insulating material selected from PI, polyamide (PA), acrylic resin, benzocyclobutene (BCB), and phenolic resin using a method such as spin coating.

A function layer 160 and a protection layer 170 may be formed on the second electrode SE.

The function layer 160 may include a capping layer 161 and a cover layer 162. The capping layer 161 may protect the second electrode SE, which is the uppermost layer of the display device OD formed in the display area DA, a refractive index of visible light generated in the display device OD may be controlled, and light efficiency may be improved.

The cover layer 162 may be formed on the capping layer 161, and the capping layer 161 and the display device OD may be protected. The cover layer 162 may control the refractive index of the visible light generated in the display device OD, and the light efficiency of the organic light-emitting display apparatus 10 may be improved. The cover layer 162 may include, for example, LiF.

The capping layer 161 may have a larger area than the display device OD, and may cover the display device OD. According to an embodiment, the cover layer 162 may be smaller than the capping layer 161.

The protection layer 170 may be formed on the function layer 160, for example, using an inorganic material such as oxide or nitride. According to an embodiment, the protection layer 170 may include an aluminum oxide, for example, $Al_2O_3$.

The thin film encapsulating layer TFE may include an encapsulating inorganic layer 120 and an encapsulating organic layer 140, external oxygen or moisture may be blocked, and the display device OD may be protected.

The encapsulating inorganic layer 120 may cover the display area DA on the substrate 101, extend to an outer region of the substrate 101, and be formed on the display area inorganic layer 110.

The encapsulating inorganic layer 120 may be formed using various materials such as oxide, nitride, or oxynitride, and may block external oxygen or moisture. For example, the encapsulating inorganic layer 120 may include $SiN_x$, $SiO_2$, or $SiO_xN_y$.

The encapsulating inorganic layer 120 may include a plurality of inorganic layers. For example, FIG. 2 illustrates that the encapsulating inorganic layer 120 may include a first inorganic layer 121 and a second inorganic layer 122. In an embodiment, the encapsulating inorganic layer 120 may include three or more inorganic layers.

The encapsulating organic layer 140 may cover at least the display area DA on the substrate 101. The encapsulating organic layer 140 may have a smaller area than the encapsulating inorganic layer 120. When used together with the encapsulating inorganic layer 120, the encapsulating organic layer 140 may have an improved encapsulating property, may relieve stress applied to the encapsulating inorganic layer 120, and may conveniently form a planarized layer.

The encapsulating organic layer 140 may be formed using various inorganic materials. For example, the encapsulating organic layer 140 may include an epoxy resin, an acrylic resin, or a PI resin.

The encapsulating organic layer 140 may include a plurality of organic layers. FIG. 2 illustrates that the encapsulating organic layer 140 may include a first organic layer 141 and a second organic layer 142. The encapsulating organic layer 140 may include three or more organic layers.

The first and second organic layers 141 and 142 may respectively be disposed between the protection layer 170 and the first inorganic layer 121 and between the first inorganic layer 121 and the second inorganic layer 122. For example, the first organic layer 141 may be disposed between the protection layer 170 and the first inorganic layer 121, and the second organic layer 142 may be disposed between the first inorganic layer 121 and the second inorganic layer 122. The encapsulating organic layer 140 may have a smaller area than the encapsulating inorganic layer 120, the first and second inorganic layers 121 and 122 and the protection layer 170 may contact each other at an outer region of the encapsulating organic layer 140, external impurities may be prevented from penetrating through a side surface of the organic light-emitting display apparatus 10, and the adhesion strength of the thin film encapsulating layer TFE may be improved.

A plurality of holes may be formed in one or more of the first organic layer 141 or the second organic layer 142, and the adhesion strength of the encapsulating layer TFE may be improved. For example, as illustrated in FIG. 2, the first inorganic layer 121 and the second inorganic layer 122 may respectively be disposed under and above the second organic layer 142. A plurality of first holes H1 formed in the second organic layer 142 may be filled with the second inorganic layer 122 disposed on the second organic layer 142, and a contact area between the first and second inorganic layers 121 and 122 may be increased.

The adhesion strength of the thin film encapsulating layer TFE may be improved. The organic light-emitting display apparatus 10 may be flexible, and the thin film encapsulating layer TFE may be prevented from being damaged or being peeled off, for example, when the organic light-emitting display apparatus 10 is bent. Since it is not necessary to increase the contact area between the first and second inorganic layers 121 and 122 at the outer region of the encapsulating organic layer 140 to improve the adhesion strength of the thin film encapsulating layer TFE, dead spaces may not be increased in the organic light-emitting display apparatus 10.

The plurality of first holes H1 may be located at the periphery of the non-display area that is formed outside the display area DA and surround the display area DA. For example, the plurality of first holes H1 may be identical in shape and arranged in a pattern such that the first holes H1 are spaced apart from each other at predetermined intervals, and the adhesion strength of the thin film encapsulating layer TFE may not be concentrated at a single side of the outer region of the display area DA, but uniformly increased in the entire outer region of the display area DA. The plurality of first holes H1 may be formed in the non-display area, and the adhesion strength of the encapsulating layer TFE may be improved. Simultaneously, the image quality of the organic light-emitting display apparatus 10 may be prevented from being deteriorated, for example, due to the moiré phenomenon caused by the pattern formed by the plurality of first holes H1.

A blocking unit 150 may be additionally formed in the peripheral area PA. For example, the blocking unit 150 may be formed on the display area inorganic layer 110 and disposed closer to an edge of the substrate 101, compared to at least the encapsulating organic layer 140, and little to no organic material for forming the encapsulating organic layer 140 may overflow toward the edge of the substrate 101 when the encapsulating organic layer 140 is formed.

The blocking unit 150 may be disposed between the display area inorganic layer 110 and the encapsulating inorganic layer 120. According to an embodiment, the blocking unit 150 may be formed on an upper portion of the display area inorganic layer 110, for example, on the interlayer insulating layer 112. The blocking unit 150 may include, for example, a first blocking unit 151, a second blocking unit 152, and a third blocking unit 153.

The first to third blocking units 151 to 153 may have different heights. For example, respective heights of the first to third blocking units 151 to 153 may be greater toward the outer region of the substrate 101, and materials for forming the first and second organic layers 141 and 142 may be prevented from overflowing when the first and second organic layers 141 and 142 are formed.

In an embodiment, all of the first to third blocking units 151 to 153 may not be included. For example, only the first blocking unit 151 or only the first and second blocking units 151 and 152 may be formed.

The blocking unit 150 may be formed of various materials. According to an embodiment, the first blocking unit 151 may be formed using the same material as the passivation layer 108 or the pixel defining layer PDL. According to an embodiment, a first layer 152a and a second layer 152b of the second blocking unit 152 may be formed using the same material as the passivation layer 108 and the pixel defining layer PDL.

According to an embodiment, a first layer 153a, a second layer 153b, and a third layer 153c of the third blocking unit 153 may respectively be formed using the same material as one or more of the passivation layer 108 or the pixel defining layer PDL. According to an embodiment, a conductive unit MUP may be disposed at a lower portion of the third blocking unit 153, for example, under the first layer 153*a*.

At an outer region of the blocking unit 150, the encapsulating inorganic layer 120 may contact the display area inorganic layer 110. The encapsulating inorganic layer 120 may extend beyond an edge of the display area inorganic layer 110, may contact an upper surface of the substrate 101 and a side of the display area inorganic layer 110, and an edge of the encapsulating inorganic layer 120 may be prevented from being delaminated, which may cause the encapsulating inorganic layer 120 to have a weak encapsulating property and be removed.

Figure 3:
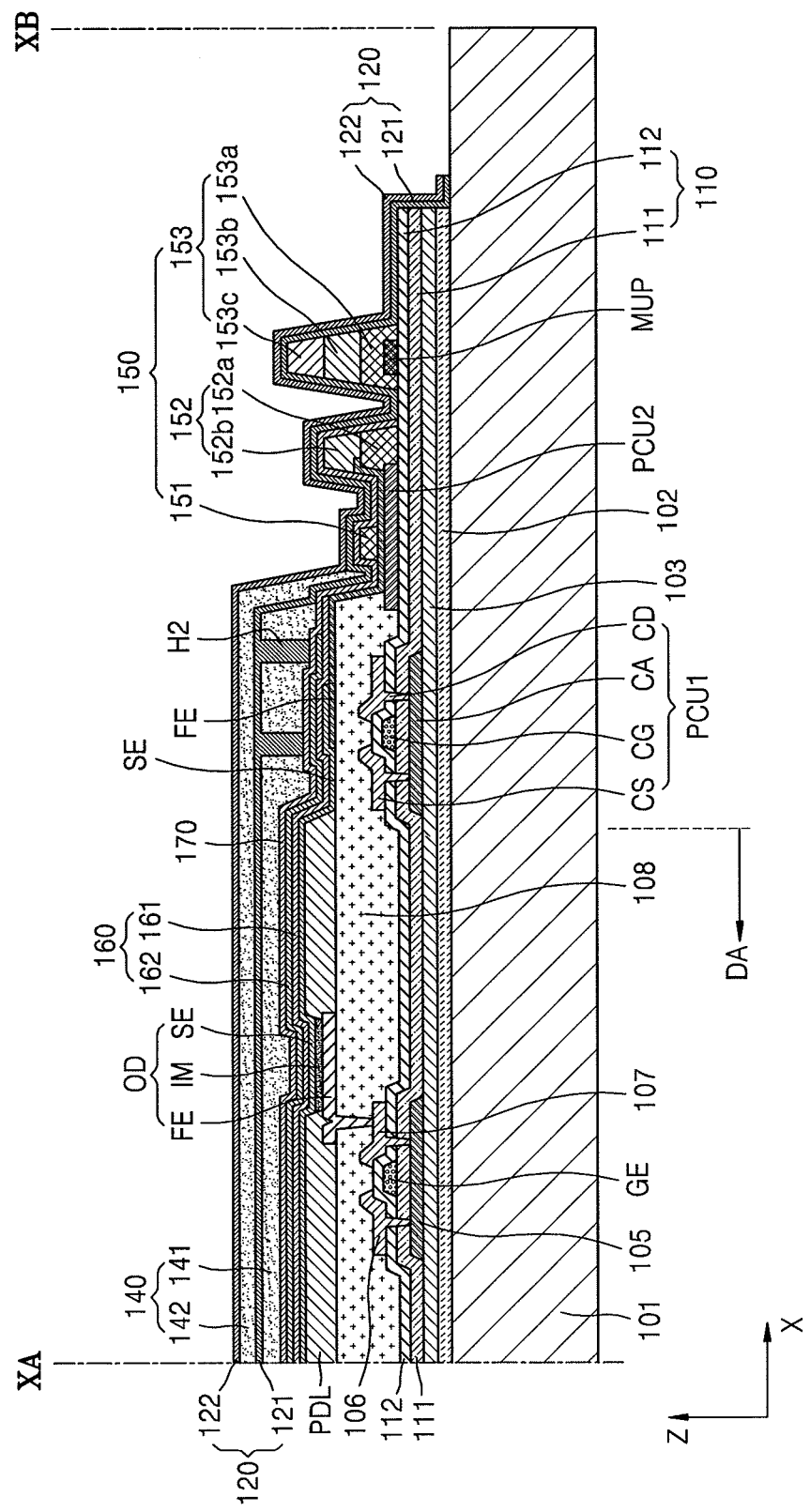
FIG. 3 illustrates a schematic cross-sectional view of a modified example of the organic light-emitting display apparatus of FIG. 1.

FIG. 3 illustrates a schematic cross-sectional view of a modified example of the organic light-emitting display apparatus 10 of FIG. 1. Like FIG. 2, FIG. 3 illustrates a schematic cross-sectional view of the organic light-emitting display apparatus 10 cut along the line XA-XB of FIG. 1. Referring to FIGS. 1 and 3, the organic light-emitting display apparatus 10 may include the substrate 101 on which the display area DA and the non-display area are defined, the display device OD formed in the display area DA on the substrate 101, and the thin film encapsulating layer TFE covering the display device OD.

The barrier layer 102 and the buffer layer 103 may be formed on the substrate 101.

The TFT may be formed in the display area DA on the buffer layer 103. The TFT may include the active layer 105, the gate electrode GE, and the source and drain electrodes 106 and 107. The gate insulating layer 111 and the interlayer insulating layer 112 may be formed not only in the display area DA but also extend to a portion of the peripheral area PA. For example, the gate insulating layer 111 and the interlayer insulating layer 112 may be formed as the display area inorganic layer 110 in the peripheral area PA.

The first circuit unit PCU1 may be formed in the non-display area. According to an embodiment, the first circuit unit PCU1 may include the circuit active layer CA, the circuit gate electrode CG, the circuit source electrode CS, and the circuit drain electrode CD. The second circuit unit PCU2 may be disposed on the interlayer insulating layer 112.

The display device OD may be formed on the passivation layer 108. The display device OD may be an OLED that may be electrically connected to the TFT and may include the first electrode FE, the second electrode SE, and the intermediate layer IM provided between the first and second electrodes FE and SE. For example, the pixel defining layer PDL may be formed on the passivation layer 108, and a predetermined region of the first electrode FE may be not covered. Then, the intermediate layer IM may be formed on the region of the first electrode FE which is not covered by the pixel defining layer PDL, and the second electrode SE may be formed on the intermediate layer IM.

The function layer 160 and the protection layer 170 may be additionally formed on the second electrode SE. The function layer 160 may include the capping layer 161 and the cover layer 162. The protection layer 170 may be formed using an inorganic material such as oxide or nitride.

The thin film encapsulating layer TFE may include the encapsulating inorganic layer 120 and the encapsulating organic layer 140, external oxygen or moisture may be blocked, and the display device OD may be protected.

The encapsulating inorganic layer 120 may include a plurality of inorganic layers. For example, FIG. 3 illustrates that the encapsulating inorganic layer 120 may include the first inorganic layer 121 and the second inorganic layer 122. In an embodiment, the encapsulating inorganic layer 120 may include three or more inorganic layers.

The encapsulating organic layer 140 may have a smaller area than the encapsulating inorganic layer 120 and include a plurality of organic layers. FIG. 3 illustrates that the encapsulating organic layer 140 may include the first organic layer 141 and the second organic layer 142. In an embodiment, the encapsulating organic layer 140 may include three or more organic layers.

The first and second organic layers 141 and 142 may respectively be disposed between the protection layer 170 and the first inorganic layer 121 and between the first inorganic layer 121 and the second inorganic layer 122. A plurality of holes may be formed in one or more of the first organic layer 141 or the second organic layer 142, and the adhesion strength of encapsulating inorganic layer 120 may be improved.

For example, as illustrated in FIG. 3, a plurality of second holes H2 may be formed in the first organic layer 141 and filled with the first inorganic layer 121, a contact area between the first inorganic layer 121 and the protection layer 170 may be increased, and the adhesion strength of the thin film encapsulating layer TFE may be improved.

The plurality of second holes H2 may be formed in various shapes, located at the periphery of the non-display area that is formed outside the display area DA, and surround the display area DA. The plurality of second holes H2 may be identical in shape and arranged in a pattern such that the second holes H2 are spaced apart from each other at predetermined intervals.

The blocking unit 150 may be additionally formed in the peripheral area PA, and little to no organic material for forming the encapsulating organic layer 140 may overflow toward the edge of the substrate 101 when the encapsulating organic layer 140 is formed.

The blocking unit 150 may be formed of various materials. According to an embodiment, the first blocking unit 151 may be formed using the same material as the passivation layer 108 or the pixel defining layer PDL. According to an embodiment, the first and second layers 152*a* and 152*b* of the second blocking unit 152 may be formed using the same material as the passivation layer 108 and the pixel defining layer PDL.

According to an embodiment, the first layer 153*a*, the second layer 153*b*, and the third layer 153*c* of the third blocking unit 153 may respectively be formed using the same material as one or more of the passivation layer 108 or the pixel defining layer PDL. According to an embodiment, the conductive unit MUP may be disposed at a lower portion of the third blocking unit 153, for example, under the first layer 153*a*.

Figure 4:
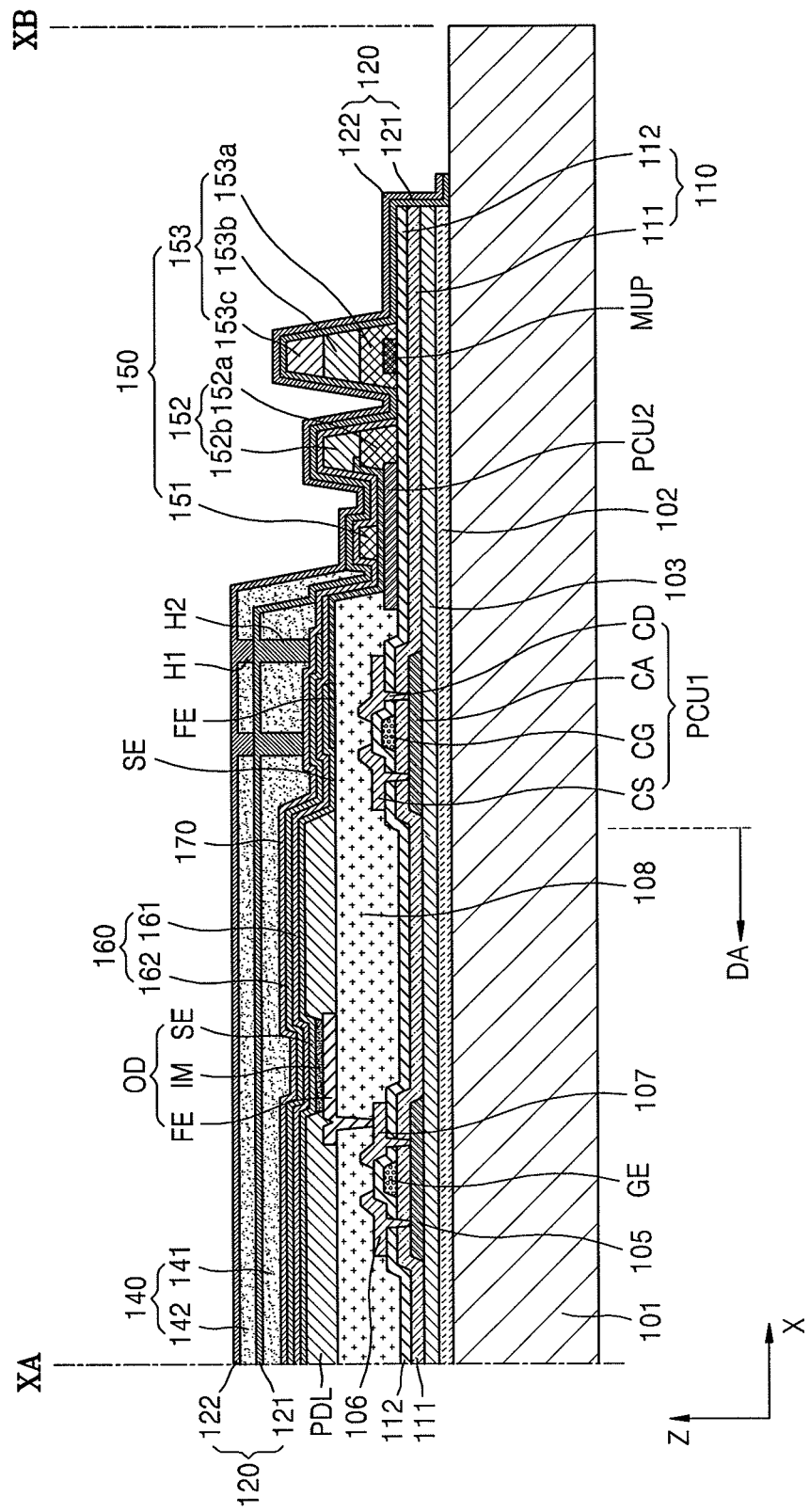
FIG. 4 illustrates a schematic cross-sectional view of another modified example of the organic light-emitting display apparatus of FIG. 1.

FIG. 4 illustrates a schematic cross-sectional view of another modified example of the organic light-emitting display apparatus 10 of FIG. 1. Like FIG. 2, FIG. 4 illustrates a schematic cross-sectional view of the organic light-emitting display apparatus 10 cut along the line XA-XB of FIG. 1. Referring to FIGS. 1 and 4, the organic light-emitting display apparatus 10 may include the substrate 101 on which the display area DA and the non-display area are defined, the display device OD formed in the display area DA on the substrate 101, and the thin film encapsulating layer TFE covering the display device OD.

The barrier layer 102 and the buffer layer 103 may be formed on the substrate 101.

The TFT may be formed in the display area DA on the buffer layer 103. The TFT may include the active layer 105, the gate electrode GE, and the source and drain electrodes 106 and 107. The gate insulating layer 111 and the interlayer insulating layer 112, which are included in the display area inorganic layer 110, may be formed not only in the display area DA but also extend to a portion of the peripheral area PA.

The first circuit unit PCU1 may be formed in the non-display area. According to an embodiment, the first circuit unit PCU1 may include the circuit active layer CA, the circuit gate electrode CG, the circuit source electrode CS, and the circuit drain electrode CD. The second circuit unit PCU2 may be disposed on the interlayer insulating layer 112.

The display device OD may be formed on the passivation layer 108. The display device OD may be an OLED that may be electrically connected to the TFT and may include the first electrode FE, the second electrode SE, and the intermediate layer IM provided between the first and second electrodes FE and SE. For example, the pixel defining layer PDL may be formed on the passivation layer 108, and a predetermined region of the first electrode FE may not be covered. Then, the intermediate layer IM may be formed on the region of the first electrode FE which is not covered by the pixel defining layer PDL, and the second electrode SE may be formed on the intermediate layer IM.

The function layer 160 and the protection layer 170 may be additionally formed on the second electrode SE. The function layer 160 may include the capping layer 161 and the cover layer 162. The protection layer 170 may be formed using an inorganic material such as oxide or nitride.

The thin film encapsulating layer TFE may include the encapsulating inorganic layer 120 and the encapsulating organic layer 140, external oxygen or moisture may be blocked, and the display device OD may be protected.

The encapsulating inorganic layer 120 may include a plurality of inorganic layers. For example, FIG. 4 illustrates that the encapsulating inorganic layer 120 may include the first inorganic layer 121 and the second inorganic layer 122. In an embodiment, the encapsulating inorganic layer 120 may include three or more inorganic layers.

The encapsulating organic layer 140 may have a smaller area than the encapsulating inorganic layer 120 and include a plurality of organic layers. FIG. 4 illustrates that the encapsulating organic layer 140 may include the first organic layer 141 and the second organic layer 142. In an embodiment, the encapsulating organic layer 140 may include three or more organic layers.

The first and second organic layers 141 and 142 may respectively be disposed between the protection layer 170 and the first inorganic layer 121 and between the first inorganic layer 121 and the second inorganic layer 122. A plurality of holes may be formed in one or more of the first organic layer 141 or the second organic layer 142, and the adhesion strength of encapsulating inorganic layer 120 may be improved.

For example, as illustrated in FIG. 4, the plurality of first holes H1 may be formed in the second organic layer 142 and the plurality of second holes H2 may be formed in the first organic layer 141. The plurality of first holes H1 may be filled with the second inorganic layer 122, and a contact area between the first and second inorganic layers 121 and 122 may be increased. The plurality of second holes H2 may be filled with the first inorganic layer 121, a contact area between the first inorganic layer 121 and the protection layer 170 may be increased, and the adhesion strength of the thin film encapsulating layer TFE may be improved.

The plurality of first holes H1 and the plurality of second holes H2 may be located at the periphery of the non-display area that is formed outside the display area DA and surround the display area DA. The plurality of first and second holes H1 and 112 may be formed at overlapping locations or different locations.

The blocking unit 150 may be additionally formed in the peripheral area PA, and little to no organic material for forming the encapsulating organic layer 140 may overflow toward the edge of the substrate 101 when the encapsulating organic layer 140 is formed. For example, the blocking unit 150 may include the first to third blocking units 151 to 153.

The blocking unit 150 may be formed of various materials. According to an embodiment, the first blocking unit 151 may be formed using the same material as the passivation layer 108 or the pixel defining layer PDL. According to an embodiment, the first and second layers 152a and 152b of the second blocking unit 152 may be formed using the same material as the passivation layer 108 and the pixel defining layer PDL.

According to an embodiment, the first layer 153a, the second layer 153b, and the third layer 153c of the third blocking unit 153 may respectively be formed using the same material as one or more of the passivation layer 108 or the pixel defining layer PDL. According to an embodiment, the conductive unit MUP may be disposed at a lower portion of the third blocking unit 153, for example, under the first layer 153a.

At an outer region of the blocking unit 150, the encapsulating inorganic layer 120 may contact the display area inorganic layer 110. An edge of the encapsulating inorganic layer 120 may extend beyond an edge of the display area inorganic layer 110, may contact an upper surface of the substrate 101 and a side of the display area inorganic layer 110, and may be prevented from being peeled off and causing the encapsulating inorganic layer 120 to have a weak encapsulating property and be removed.

As described above, an organic light-emitting display apparatus according to the one or more of the above exemplary embodiments may include a thin film encapsulating layer with improved adhesion strength.

By way of summation and review, an organic light-emitting display apparatus is a self-emissive display apparatus, in which holes injected from the hole injection electrodes and electrons injected from the electron injection electrodes may combine in the organic emission layer and generate excitons, and light may be generated as the excitons drop from an excited state to a ground state.

Since an organic light-emitting display apparatus is self-emissive, a separate light source is unnecessary, and an organic light-emitting display apparatus may be driven at a low voltage and be configured to be lightweight and thin. An organic light-emitting display apparatus may have excellent features such as a wide viewing angle, high contrast ratio, and quick response time.

One or more exemplary embodiments provide an organic light-emitting display apparatus that may include a thin film encapsulating layer with improved adhesion strength.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
a substrate including display area and a non-display area;
a display device in the display area on the substrate; and a thin film encapsulating layer that covers the display device and includes an encapsulating inorganic layer and an encapsulating organic layer, the encapsulating inorganic layer including a plurality of inorganic layers and the encapsulating organic layer including a plurality of organic layers, at least one organic layer among the plurality of organic layers including a plurality of holes, and the plurality of holes being filled with an inorganic layer on the at least one organic layer.

2. The apparatus as claimed in claim 1, wherein the plurality of holes is in the non-display area.

3. The apparatus as claimed in claim 1, wherein the plurality of holes surrounds the display area.

4. The apparatus as claimed in claim 1, wherein the holes are identical in shape and arranged in a pattern such that the plurality of holes are spaced apart from each other at predetermined intervals.

5. The apparatus as claimed in claim 1, wherein:
the thin film encapsulating layer includes a first organic layer, a first inorganic layer, a second organic layer, and a second inorganic layer that are sequentially stacked, and the first and second inorganic layers contact each other at an outer region of the first and second organic layers.

6. The apparatus as claimed in claim 5, wherein:
the plurality of holes is in the second organic layer, and
the plurality of holes is filled with the second inorganic layer such that the second inorganic layer contacts the first inorganic layer.

7. The apparatus as claimed in claim 6, wherein:
a protection layer including an inorganic material is between the display device and the first organic layer, and a plurality of second holes is in the first organic layer and filled with the first inorganic layer such that the first inorganic layer contacts the protection layer.

8. The apparatus as claimed in claim 5, wherein:
a protection layer including an inorganic material is between the display device and the first organic layer, and a plurality of second holes is in the first organic layer and filled with the first inorganic layer such that the first inorganic layer contacts the protection layer.

9. The apparatus as claimed in claim 1, further comprising a thin film transistor that is electrically connected to the display device and includes an active layer, a gate electrode, a source electrode, and a drain electrode, wherein:

a gate insulating layer is between the active layer and the gate electrode, an interlayer insulating layer is between the gate electrode, the source electrode, and the drain electrode, and the gate insulating layer and the interlayer insulating layer extend to the non-display area and form a display area inorganic layer on the substrate.

10. The apparatus as claimed in claim 9, wherein the encapsulating inorganic layer covers the display area, is on the display area inorganic layer, and extends to an outer region of the substrate.

11. The apparatus as claimed in claim 10, further comprising a blocking unit between the display area inorganic layer and the encapsulating inorganic layer, in the display area.

12. The apparatus as claimed in claim 11, wherein the blocking unit includes a plurality of blocking units.

13. The apparatus as claimed in claim 12, wherein respective heights of the plurality of blocking units are different and are greater toward the outer region of the substrate.

14. The apparatus as claimed in claim 11, further comprising a passivation layer that covers the thin film transistor and a pixel defining layer on the passivation layer, wherein the blocking unit includes a same material as one or more of the passivation layer or the pixel defining layer.

15. The apparatus as claimed in claim 10, wherein the encapsulating inorganic layer extends beyond an edge of the display area inorganic layer and contacts a side of the display area inorganic layer and an upper surface of the substrate.

16. The apparatus as claimed in claim 1, wherein the display device is an organic light-emitting device including a first electrode, a second electrode, and an intermediate layer between the first and second electrodes.

17. The apparatus as claimed in claim 1, wherein at least one of the plurality of organic layers is between the plurality of inorganic layers.

* * * * *